Sept. 13, 1966 G. BRUCK ET AL 3,272,909

PRINTED CIRCUIT PACKAGE WITH INDICIA

Filed Nov. 4, 1964

INVENTORS.
GEORGE BRUCK
JOHN F FRENO
BY Alden D. Redfield
Charles M. Hogan
ATTORNEYS.

3,272,909

PRINTED CIRCUIT PACKAGE WITH INDICIA

George Bruck and John F. Freno, Cincinnati, Ohio, assignors to Avco Corporation, Cincinnati, Ohio, a corporation of Delaware Filed Nov. 4, 1964, Ser. No. 408,911

1 Claim. (Cl. 174—68.5)

The present invention relates to electronic circuit packaging and, more specifically, it provides means and techniques for the assembly of stacked circuitry in micro-electronic modules which feature strong weldable leads for external connections.

A primary object of the invention is to provide an electronic circuit package comprising a sandwich of alternate insulating and active elemens together with a novel arrangement of windows and perforations providing availability for weldable connections.

Another object of the invention is to provide the combination aforesaid, so constructed and arranged as to be compatible with and to permit the use of all commercial techniques for printing and depositing circuit patterns.

Another object of the invention is to provide such a construction together with Cartesian coordinate indicia indicative of those zones in a checkerboard pattern which are to remain covered by conductive material.

A further object of the invention is to provide such a combination together with staggered number indicia which visually indicate the number of conductive layers in any given sandwich.

Another object of the invention is to provide methods and processes for manufacturing sandwich constructions as described above.

A further object of the invention is to provide an electronic circuit package of the type under consideration having weldable leads, together with major circuit components having leads welded to said leads.

For a better understanding of the invention, together with other and further objects, advantages, and capabilities thereof, reference is made to the following description of the appended drawings, in which:

FIG. 1 is a perspective view of an electronic circuit package in accordance with the invention, this package being in inverted position (compared to FIGS. 2–6) and comprising two circuit boards and three insulating boards, the disposition of the package being such that the leads projecting from the circuit patterns extend vertically upwardly;

FIGS. 2, 3, 4, 5, and 6 are, respectively, perspective views of the respective boards as follows: Insulating board 15, circuit board 16, insulating board 17, circuit board 18, and insulating board 19, shown in registry but spaced from each other for clarity in exposition;

Figures 1, 2, 3, 4, 5, 6, 7, 8, 9:
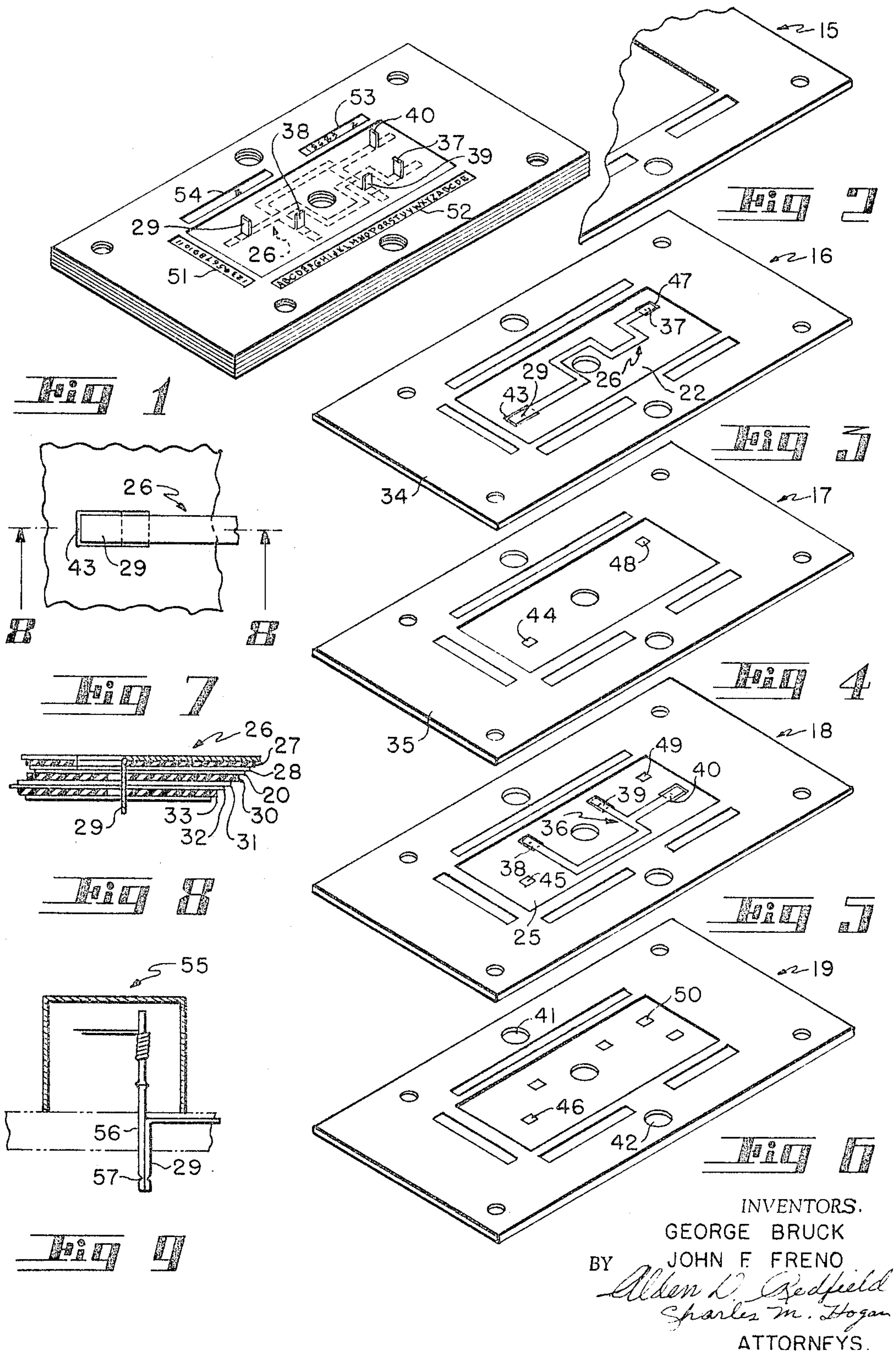
FIG. 7 is an enlarged plan view of a portion of FIG. 3, emphasizing conductor 26.
FIG. 8 is a detailed sectional view of the FIGS. 3–5 boards, as assembled, see line 8—8 of FIG. 7, looking in the direction of the arrows.
FIG. 9 is a cross-sectional view showing how the lead from a major circuit component is soldered typically to a lead from a circuit pattern.

The circuit package of FIG. 1 comprises the principal elements illustrated in FIGS. 2–6, inclusive, consisting of a top insulating board 15, a circuit board 16, an intermediate insulating board 17, another circuit board 18, and a bottom insulating board 19.

Two types of boards are processed in accordance with the invention, and these are referred to as "circuit boards" and "insulating boards".

The processing of a circuit board, such as 16 (FIG. 3) begins with a laminate which comprises a thin sheet of nickel, an intermediate sheet of Mylar 27, and a thin sheet of copper 28. Now making parenthetical reference to FIG. 8, it will first be observed that that figure is a cross section of only three of the boards—that is, those numbered 16, 17, and 18. The thin sheet of nickel which has just been referred to leaves circuit pattern 26 (and, optionally, margin 34), both shown in FIG. 3, when etched away. Photo-resist is applied to the copper, and a protective coating is applied to the nickel. Then the copper is exposed to the hole pattern. First the copper is etched away and then the Mylar is etched away when holes are indicated in the pattern.

In the next step photo-resist is applied to the nickel, and the nickel is exposed to the circuit pattern. Finally the unexposed nickel and the remaining copper are etched away.

Now, it will be noted that, in the particular finished board 16 here chosen for purposes of illustration, there are, in addition to the nickel circuit pattern 26 on one side of the board, margins of nickel (34, FIG. 3) on one side of the board and copper on the other side of the board. In practice these margins are made quite narrow and may, within the scope of the invention, be reduced to zero. When the margins are retained, they aid in lending rigidity to the final package. At this point it should be clearly understood that in alternative embodiments of the invention such margins are narrowed or diminished to zero.

Referring now to the processing of the insulating boards, such as 17 (FIG. 4), the processing begins with the formation of a laminate comprising a thin sheet of copper 20, an intermediate sheet of Mylar 30, and another sheet of copper 31. The detailed arrangement of these three layers is not shown in FIG. 4 but is shown in FIG. 8. Photo-resist is applied to one side of the laminate, and a protective coating is applied to the other side. Said one side is exposed to the hole pattern, and the copper is etched away on said one side wherever holes are indicated in said pattern, utilizing ferric chloride, for example. Then the Mylar is etched away wherever there are holes, using sulphuric acid, for example. As a final step, the remaining undesired copper is etched away—i.e., in the particular embodiment shown, the copper within the boundaries formed by the residual copper margins 35, which are permitted to remain on the insulating board for purposes of structural strength. It will be understood that there are copper margins on each side of each insulating board, such as 17. While these margins are shown in the illustrative embodiment herein discussed, it will be understood that the margins 35 may be narrowed down to zero within the scope of the invention. Optionally, the insulating boards may be made with copper on one side only.

Referring now to the circuit laminates 16 and 18, the generally central Mylar-faced quadrangular areas numbered 22 and 25, respectively, are referred to as electrical utility areas. These areas are surrounded by the rectangular shaped metallic margins, such as 34, which are provided solely for purposes of mechanical utility or security.

The elements 15, 17, and 19 are referred to as insulating boards or laminates because, electrically, they operate simply as insulators.

Attention is now further directed to the construction of each circuit laminate, for example that numbered 16. As indicated above, it comprises the underlying copper element 28 and the sheet of Mylar or glass-filled epoxy 27 and the overlying raised metal elements 26 and 34, of which the electrical circuit pattern is of particular importance. This conductive pattern may be provided on top of the insulating sheet 27 by any one of the conventional circuit-fabricating processes—for example, printing, stamping, the preferred method of selective etching, and metal deposition.

Similarly, the circuit laminate 18 comprises a different printed circuit pattern 36. At this point passing notice is made of the fact that the circuit pattern 26 has two leads, and the circuit pattern 36 has three leads, making a total of five leads in all. Those included in pattern 26 are numbered 29, 37, and those included in pattern 36 are numbered 38, 39, 40, as will be apparent from an examination of FIGS. 1, 3, and 5.

Please note the four small outer holes in FIG. 6 and the corresponding holes in FIGS. 2–5. These permit the several elements and laminates shown in FIGS. 2–6 to be placed in a single jig, aligned, and cured, forming a neat sandwich. The holes numbered 41 and 42 in FIG. 6 and alike holes in FIGS. 2–5 are utilized later—i.e., for holding the package when major components are put in place.

The insulating sheets can be made either of Mylar or a rigid plastic material such as a glass-filled epoxy.

A feature of particular interest resides in the fact that, whenever a lead such as 29 is provided, there is cut out of the immediately associated and underlying insulating sheet a window such as that numbered 43 in FIG. 3. This window is sufficiently large to permit the lead or tab 29 to be bent at right angles, or downwardly in relation to the circuit pattern 26 (FIG. 8). Whenever a bent tab such as 29 is provided, together with its associated window, there are formed registering apertures (see 44, 45, and 46 in the non-associated laminates or boards) to the end that the tab may project downwardly through the various laminates 17, 18, and 19 (FIGS. 4–6) and out to the exterior (FIG. 1). Similarly, now making reference to lead 37, there is provided in the immediately associated insulating layer 27 a window 47, and in the non-associated elements and laminates there are provided registering apertures 48, 49, and 50.

While the circuit patterns of the preferred embodiment herein shown have been prepared by selective etching, it will be understood that in the alternative they may be printed, deposited, or stamped. Additionally, they may be made up of pieces of weldable material joined together.

While in the particular embodiment shown there are a top insulating board and two circuit boards and two other insulating elements, these are shown by way of illustration and not of limitation.

The mode of assembly will be apparent from FIGS. 2–6. The laminates 16 and 18 are prepared as outlined above, and tabs 29, 37, 38, 39, and 40 are turned downwardly. Then the laminates are stacked together, placed in a jig, and fused together or cured. The result (when inverted) is the FIG. 1 package, complete with the five external tabs or leads.

Additional advantages are now invited to attention. Please note that, whenever any portion of pattern 26 crosses over any portion of pattern 36, the two patterns are separated by insulation. Note also that each circuit pattern constitutes a conductive covering of a part of a checkerboard pattern consisting of a number of squares identifiable with reference to one axis by letter indicia, and with reference to the other axis by Arabic numeral indicia. In making up any circuit laminate, on the copper sheet of which are preprinted the horizontally oriented indicia 52 and the vertically oriented indicia 51 (FIG. 1), directions for printing the circuit pattern can be given by simply designating by letter and numeral the squares in the checkerboard pattern which are to remain covered by conductive material. That is, the directions can be placed on the insulating sheet of the circuit laminate. The various metallic margins are formed with registering slots as required to permit viewing of the indicia. The same technique may be used, as illustrated at 53, for example, to display a part number. Additionally, all of the various metallic margins may be slotted as shown at 54 and the Arabic numeral 1 placed on the insulating portion of circuit board 16, and the Arabic numeral 2 on the insulating portion of circuit board 18 to indicate that the number of circuit boards in the package is two, the horizontal slot 54 permitting the Arabic numeral 2 to be plainly visible. It will be understood that the glass-filled epoxy is light-transmitting.

In accordance with the invention a major component such as that illustrated at 55 in FIG. 9 is provided with a metallic lead 56, preferably of nickel, and it projects through the window and series of aligned holes through which the tab 29 projects, the leads 56 and 29 being welded together. Replacement of such major components simply involves snipping off the weld at 57, replacing the major component, and rewelding. This is a particularly advantageous method for the ready replacement of major components.

While there has been shown and described what is at present considered to be the preferred embodiment of the invention, it will be understood by those skilled in the art that various modifications and changes may be made therein without departing from the scope of the invention as defined by the appended claims. For example, the insulating board 15 can be simply a single sheet of insulating material, because it merely serves as a top cover for the stack of boards as the same is molded together.

We claim:

A circuit package comprising:

a plurality of insulating laminates, each comprising a sheet of light-transmitting insulating material with at least one metallic marginal reinforcement;

a plurality of circuit laminates each comprising a sheet of insulating material with metallic marginal reinforcements and an individually associated circuit pattern;

the insulating sheets of said circuit laminates being formed with windows adjacent the ends of the associated circuit patterns;

said ends being bent relative to the associated circuit laminates to form projecting tabs;

the insulating sheets of said circuit laminates being formed with apertures as required to permit passage of non-associated tabs;

said insulating laminates being formed with apertures as required to permit passage of projecting tabs;

and the metallic marginal reinforcements being formed with aligned slots to permit reading of indicia on at least one of the sheets of insulating material.

References Cited by the Examiner

UNITED STATES PATENTS

| | | | |
|---|---|---|---|
| 2,508,030 | 5/1950 | Karns. | |
| 3,006,982 | 10/1961 | Krantz | 174—68.5 |
| 3,098,951 | 7/1963 | Ayer et al. | 174—68.5 X |
| 3,151,278 | 9/1964 | Elarde | 174—52 X |
| 3,186,883 | 6/1965 | Frantzen. | |

OTHER REFERENCES

Reed: "Etching of Epoxy Glass Circuit Board," published in IBM Technical Disclosure Bulletin, vol. 6, No. 8, January 1964, page 82.

Sayles: "Welded Circuitry for Miniaturization," published in Electronic Products Magazine, June 1961, pages 8 and 9.

LEWIS H. MYERS, *Primary Examiner.*

DARRELL L. CLAY, LARAMIE E. ASKIN, *Examiners.*